United States Patent
Barringer et al.

(10) Patent No.: US 6,493,235 B1
(45) Date of Patent: Dec. 10, 2002

(54) AUTO DOCKING/LOCKING RACK HARDWARE FOR EASY SERVICEABILITY OF PRINTED CIRCUIT CARDS IN TIGHT SPACES

(75) Inventors: Dennis R. Barringer, Wallkill, NY (US); Budy D. Notohardjono, Poughkeepsie, NY (US); Edward J. Seminaro, Milton, NY (US); Harold M. Toffler, Middlehope, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/941,912

(22) Filed: Aug. 29, 2001

(51) Int. Cl.$^7$ ................................................ H05K 5/00
(52) U.S. Cl. ...................... 361/756; 361/802; 361/741; 361/747; 174/35 R; 174/51; 312/223.1; 312/223.2
(58) Field of Search ................................ 361/756, 727, 361/741, 686, 802, 759, 726, 740, 747, 754, 801, 800, 816, 818; 174/35 R, 51; 312/223.1, 223.2; 257/99

(56) References Cited

U.S. PATENT DOCUMENTS

| | | | | |
|---|---|---|---|---|
| 4,313,150 A | | 1/1982 | Chu | 361/399 |
| 4,353,469 A | * | 10/1982 | Etchison et al. | 211/41.17 |
| 4,498,123 A | | 2/1985 | Fuss et al. | 361/427 |
| 4,519,016 A | * | 5/1985 | Bradley et al. | 211/41.17 |
| 5,285,353 A | | 2/1994 | Buck et al. | 361/732 |
| 5,297,000 A | | 3/1994 | Freige et al. | 361/692 |
| 5,325,269 A | | 6/1994 | Someno | 361/796 |
| 5,428,535 A | | 6/1995 | Katsumata et al. | 364/424 |
| 5,575,546 A | * | 11/1996 | Radloff | 174/35 R |
| 5,586,003 A | | 12/1996 | Schmitt et al. | 361/683 |
| 5,679,923 A | * | 10/1997 | Le | 174/35 R |
| 5,724,231 A | | 3/1998 | Winick et al. | 361/759 |
| 5,751,558 A | * | 5/1998 | Gullicksrud et al. | 211/41.17 |
| 5,774,344 A | | 6/1998 | Casebolt | 361/800 |
| 5,856,632 A | * | 1/1999 | Bostrom et al. | 174/35 GC |
| 6,047,836 A | * | 4/2000 | Miles | 211/41.17 |
| 6,061,244 A | | 5/2000 | O'Sullivan et al. | 361/727 |
| 6,080,930 A | * | 6/2000 | Lommen et al. | 174/35 GC |
| 6,128,187 A | * | 10/2000 | Mimlitch et al. | 211/41.17 |
| 6,201,711 B1 | * | 3/2001 | Cherniski et al. | 174/35 GC |
| 6,349,042 B1 | * | 2/2002 | Mills et al. | 165/121 |
| 6,395,976 B1 | * | 5/2002 | Koradia et al. | 174/35 GC |
| 6,403,879 B1 | * | 6/2002 | Clements et al. | 174/35 GC |

* cited by examiner

*Primary Examiner*—David Martin
*Assistant Examiner*—Hung Bui
(74) *Attorney, Agent, or Firm*—Lawrence D. Cutter

(57) ABSTRACT

A guide structure and matching printed circuit card carrying cartridge provides hot pluggability functionality even when electronic circuit components need to be disposed in very tight spaces. The guide structure includes front and rear portions linked by slot-defining rungs. Front and rear apertures provide alignment and/or locking functions. The guide structure is easily manufacturable from a single sheet of metal which is stamped and formed to meet all desirable design specifications. A matching self-contained docking cartridge is provided with mating parts for these apertures. EMI shielding and cooling functions are also accommodated.

10 Claims, 6 Drawing Sheets

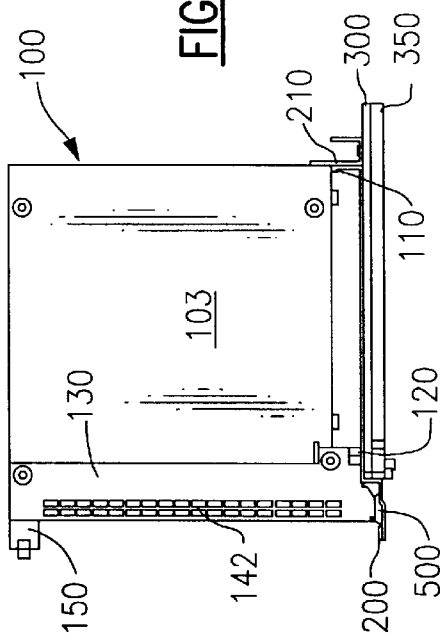
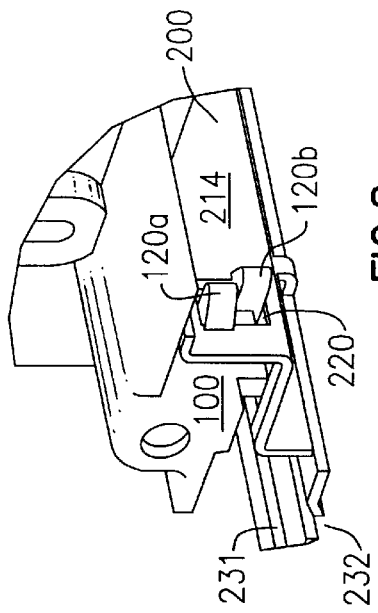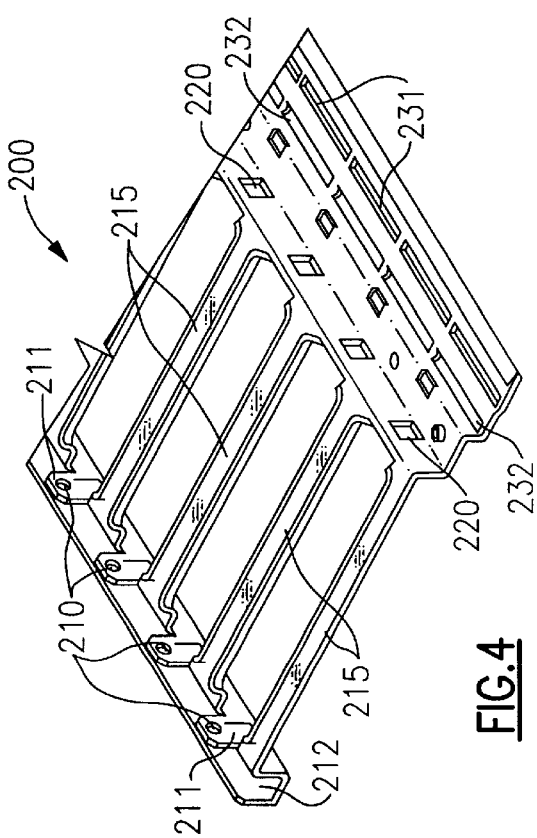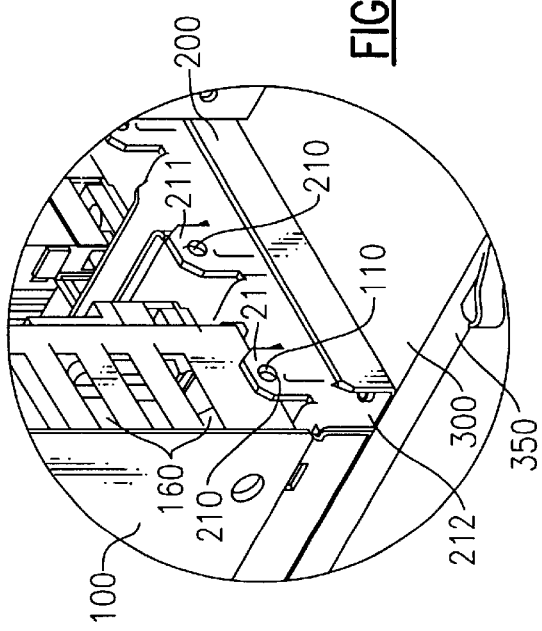

AUTO DOCKING/LOCKING RACK HARDWARE FOR EASY SERVICEABILITY OF PRINTED CIRCUIT CARDS IN TIGHT SPACES

BACKGROUND OF THE INVENTION

The present invention is generally directed to guides, guide assemblies and/or guide mechanisms for use in conjunction with pluggable cartridges for inserting printed circuit cards into and for removing them from printed circuit boards. More particularly, the present invention is directed to an integral guide structure which provides a guiding, alignment and locking function. Even more particularly the present invention includes a cartridge which mates with the desired guide structure so that cartridges are firmly locked into position to permit a self-contained actuation mechanism within the cartridge to slidably move a printed circuit card within the cartridge so as to forcibly mate a card edge electrical connector to a matching printed circuit board mounted connector.

The past twenty-five or so years have seen the development of ever smaller electrical circuit components at the chip level. However, to take fullest advantage of achievements in electrical circuit miniaturization, one must package the resultant printed circuit cards containing these chips in an efficient manner. Clearly, the packaging of printed circuit cards in tight spaces is a direct logical extension of increasing chip level circuit densities. It should also be noted that the tight packaging of integrated circuit chips on printed circuit cards and the correspondingly dense packaging of the printed circuit cards is a design goal that is carried out for more than just the convenience of compactness. Compactness provides shorter distances between circuit components which, in turn, serves the very desirable goal of being able to operate the circuits effectively at higher frequencies, thus increasing the speed of numerous different forms of electrical systems, including but not limited to data processing systems.

Moreover, mainly for reasons associated with long-term system operation and reliability, it is likewise very desirable to be able to easily insert and remove these printed circuit cards even when they are disposed in very tight spaces. The insertion and removal operations are also provided as an important part of a "hot-pluggability" function which is very desirable for "on the fly" repairs, replacements, maintenance and upgrades.

With increased circuit density there has also been a concomitantly driven increase in the number of power, signal and control lines which require electrical connections to be made between printed circuit cards and printed circuit boards. This means that the electrical connectors that carry these various electrical circuits between the cards and the boards have been required to carry more and more separate individual connections. A significant consequence of the increase in the number of individual electrical connections, all of which require surety of contact, is the corresponding increase in the force needed to insert printed circuit connectors into mating printed circuit board sockets. This aspect provides special design considerations for self-contained cartridges that carry printed circuit cards which are meant to be inserted into printed circuit boards via actuating mechanisms contained within the cartridge itself.

The increase in the number of connections also poses other problems in the design of desirably compact packaging systems, particularly those designed for easy cartridge insertion and removal. In particular, the increased number of connections results in the use of connectors with an increased number of pins and socket holes. Since these structures are present in larger and larger numbers, the pin-and-socket connections (or the like) are themselves packed together with smaller and smaller distances between them. This aspect of the packaging problem brings along with it the problem of connecting pin alignment for the purpose of physically connecting oppositely disposed mating pins and socket holes. Alignment failure can severely and permanently damage both the printed circuit card and the printed circuit board into which the card is to be inserted.

Also of note is the fact that one of the principle purposes of the present invention is to provide cartridges which are capable of this self-contained insertion actuation function. Even more particularly, the present invention employs cartridges which are designed to have no physical contact with any external structure except the printed circuit board itself. This means that cartridges of the present invention do not require any form of actuation mechanism which relies upon external structures such as an enclosure, cabinet or frame or upon any form of adaptation provided in a surrounding cabinet, frame or enclosure. This also means that there are no frictional elements disposed between the printed circuit board and its surrounding structures. And this is turn implies that the entire printed circuit board may be inserted and removed as an integral, fully populated structure, that is, with a full set of printed circuit cards inserted (within cartridges). However, this desirable feature makes cartridge design more difficult in that there still must be provided some mechanism for resisting insertion forces, however, slight they may sometimes be.

Additionally, if the printed circuit board is itself intended to be inserted and removed with its complement of printed circuit cards in place, it should also be substantially rigid particularly in those circumstances in which the horizontal dimensions of the board are large with respect to its vertical height. If the printed circuit board is wide and long but thin, then insertion in particular can result in undesirable bending and flexing of the board which is commonly referred to as "oil canning."

As an additional constraint on packaging design, it should be appreciated that, with increased circuit density, there is also a concomitant increase in power density and heat dissipation. Accordingly, packaging designs should be fully compatible with those aspects of system design associated with cooling functions. Also, to whatever extent possible, packaging designs should be: economical to produce; function smoothly; require little or no maintenance; be producible from inexpensive, readily available materials; and be reliably operable over a large number of insertion and removal operation cycles.

Yet one other concern arises in electrical systems as circuit feature size shrinks, operating frequencies increase and packaging densities grow larger, namely, the generation of electromagnetic interference (EMI). Electronic circuit packaging designs should thus also be compatible with structures and configurations that are employed to prevent the leakage of electromagnetic interference. To whatever extent possible, packaging designs should also include structures which actually contribute positively to the containment of electromagnetic interference.

Furthermore, it is noted that whatever guide and locking mechanism is employed, it is ultimately placed on the printed circuit board which is intended for printed circuit card insertion (and later removal, as needed or desired).

Accordingly, the guide should be compatible with printed circuit board function and, if possible, contribute to its structural rigidity to counteract the above-mentioned oil-canning effect.

It is also noted that the present discussion refers to printed circuit boards and printed circuit cards. As contemplated herein, the printed circuit board is the larger component into which at least one printed circuit card is inserted for purposes of electrical connection. The present invention places no specific limits on either the size of a printed circuit board or the size of a printed circuit card. In the most general situation, a circuit board will be populated with a plurality of printed circuit cards. That is, the printed board will have a number of printed circuit cards inserted therein. Accordingly, as used herein, the terms "printed circuit board" and "printed circuit card" are considered to be relative terms.

Accordingly, the present inventors are presented with the following sometimes competing packaging problems: connector pin alignment, cartridge alignment, rigid connection to a printed circuit board, circuit board oil canning, dense and close packaging, cooling, electromagnetic interference shielding, hot pluggability, the desire to provide an easy-to-load cartridge for carrying printed circuit cards, mechanisms requiring a mechanical advantage for insertion and removal of printed circuit cards, the removal of fully populated printed circuit boards and the insertion thereof, and means to provide a cooperative EMI shielding arrangement in a system which provides circuit board guide mechanisms which do not require physical contact with a surrounding enclosure or cabinet.

SUMMARY OF THE INVENTION

In accordance with a preferred embodiment of the present invention, a guide structure which is especially suited for insertion of self-contained pluggable printed circuit board cartridges comprises three major portions: a rear portion, a front portion and slot defining rungs extending between the front and rear portions. The rear portion includes at least one vertical tab with an alignment aperture in the tab. This aperture is meant to receive a corresponding alignment pin on the cartridge to be inserted. The guide structure also includes a forward portion which includes a step. The vertical portion of the step also includes at least one other alignment aperture. One or both of the alignment apertures also provides a locking function. There is also at least one pair of cartridge slot defining rungs extending from the rear portion to the forward portion with the pair of rungs being disposed on opposite sides of a matching pair of the alignment apertures, one of which is disposed in the vertical tab with the other aperture being disposed in the vertical step.

In preferred embodiments of the present invention, the guide structure is formed from a single sheet metal stamping. The rear portion preferably includes a channel which act as a stiffening rib both for the guide structure itself and for the printed circuit board on which it is mounted.

The present invention also includes a mating printed circuit card carrying pluggable cartridge which is intended for use with the above-described guide structure. A desirable pluggable cartridge intended for such use preferably comprises a rigid frame with a printed circuit card having a pluggable electrical connector being slidably disposed within the frame. A lever mechanism, disposed between the rigid frame and the printed circuit card is provided for slidably moving the printed circuit card relative to the frame. A guide pin is externally affixed to the frame and a locking pin is preferable affixed externally to the frame. Thus, the cartridge is guided into and locked into a mating printed circuit-board-level guide structure so that the lever mechanism may be actuated to cause the pluggable electrical connector on the printed circuit card to mate with a corresponding connector on the printed circuit board.

Accordingly, it is an object of the present invention to provide structures and mechanisms for densely package electronic circuit components while at the same time providing easy access and component replacement capabilities, especially for hot pluggability applications.

It is a further object of the present to provide a guide for use with cartridges containing pluggable printed circuit cards.

It is also an object of the present invention to provide a design for a cartridge guide which is easily and economically fabricatable in the form of a single sheet of stamped metal.

It is a still further object of the present invention to provide a board level docking mechanism which provides guide, alignment, locking and holding functions.

It is a further object of the present invention to provide a guide mechanism for printed circuit boards which also serves the function of providing an added degree of stiffness to the circuit board on which it is mounted.

It is still another object of the present invention to provide a board level cartridge guide mechanism which not only provides a certain level of electromagnetic interference shielding but which also cooperates with the inserted cartridge to meld together card level and board level shielding functions.

It is also another object of the present invention to provide a printed circuit card carrying cartridge which not only mates with but which also cooperatively interacts with a desirable board level guide mechanism.

It is a further object of the present invention to provide a printed circuit card carrying cartridge which is capable of providing flow through air cooling passages.

It is yet another object of the present invention to provide a docking cartridge which is fool proof and which does not require the use of tools.

It is a still further object of the present invention to facilitate the packaging of electronic circuit components in tight spaces.

It is also another object of the present invention to be able to provide electronic circuit packaging design structures which facilitate easy insertion and removal of printed circuit cards.

Lastly, but not limited hereto, it is an object of the present invention to facilitate packaging designs for increasingly dense, fast and powerful electronic systems.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 4 is a detailed view of a portion of the guide shown in FIG. 3;

FIG. 5 is an isometric view showing a detailed view of the portion a FIG. 2 which specifically relates to the function of the guide pin;

FIG. 6 is a side elevation view illustrating the locations of the locking and guide pin structures particularly as they relate to their positions relative to the cartridge and the board level guide structure;

FIG. 8 is an isometric view illustrating the desired shape and arrangement for a snap-in locking pin;

DETAILED DESCRIPTION OF THE INVENTION

Figure 1:
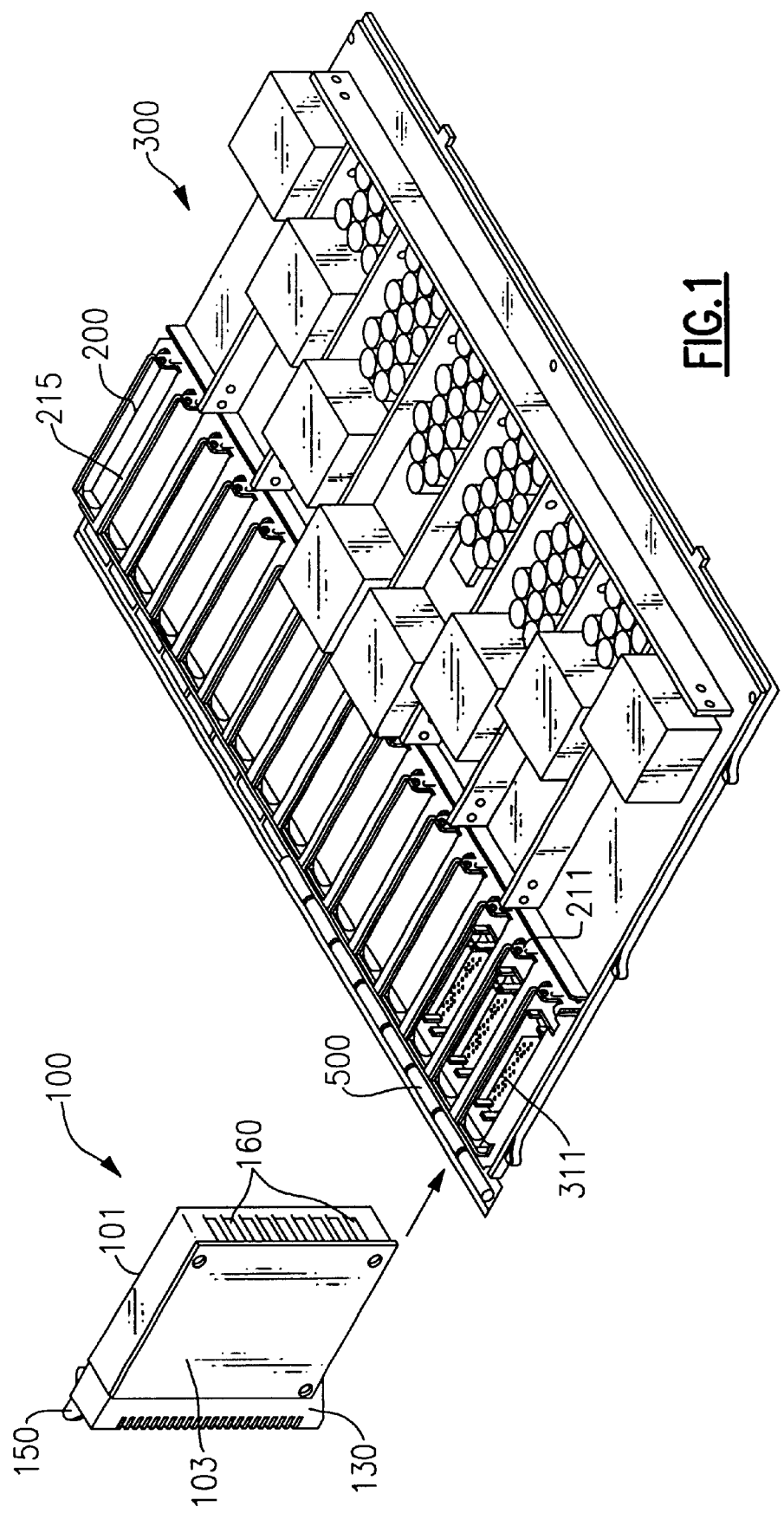
FIG. 1 is an isometric view illustrating a cartridge of the present invention being inserted into a guide of the present invention which is disposed on a rigid printed circuit board with the guide also operating as a printed circuit board stiffener for increased rigidity.

FIG. 1 provides an overall illustration of the various aspects of the present invention. In particular, it is seen that there is provided pluggable cartridge 100 which is shown just prior to its being inserted into guide structure 200. Cartridge 100 comprises four major components: front wall 103, back and side walls 101, bezel 130 and printed circuit card 140 (see FIG. 7). Guide structure 200 also serves a dual purpose in that it provides a measure of stiffness to printed circuit board 300. Printed circuit board 300 also contains connectors 311 which mate with one or more corresponding edge connectors 145 (in FIG. 7) on the printed circuit card contained within cartridge 100. While FIG. 1 suggests that connectors 311 are female connectors, this aspect is irrelevant to the design and operation of the present invention in its most general form. However, it is the preferred design, since it is relatively easy to fabricate printed circuit cards so as to provide the male connector as part of the card itself.

Figure 2:
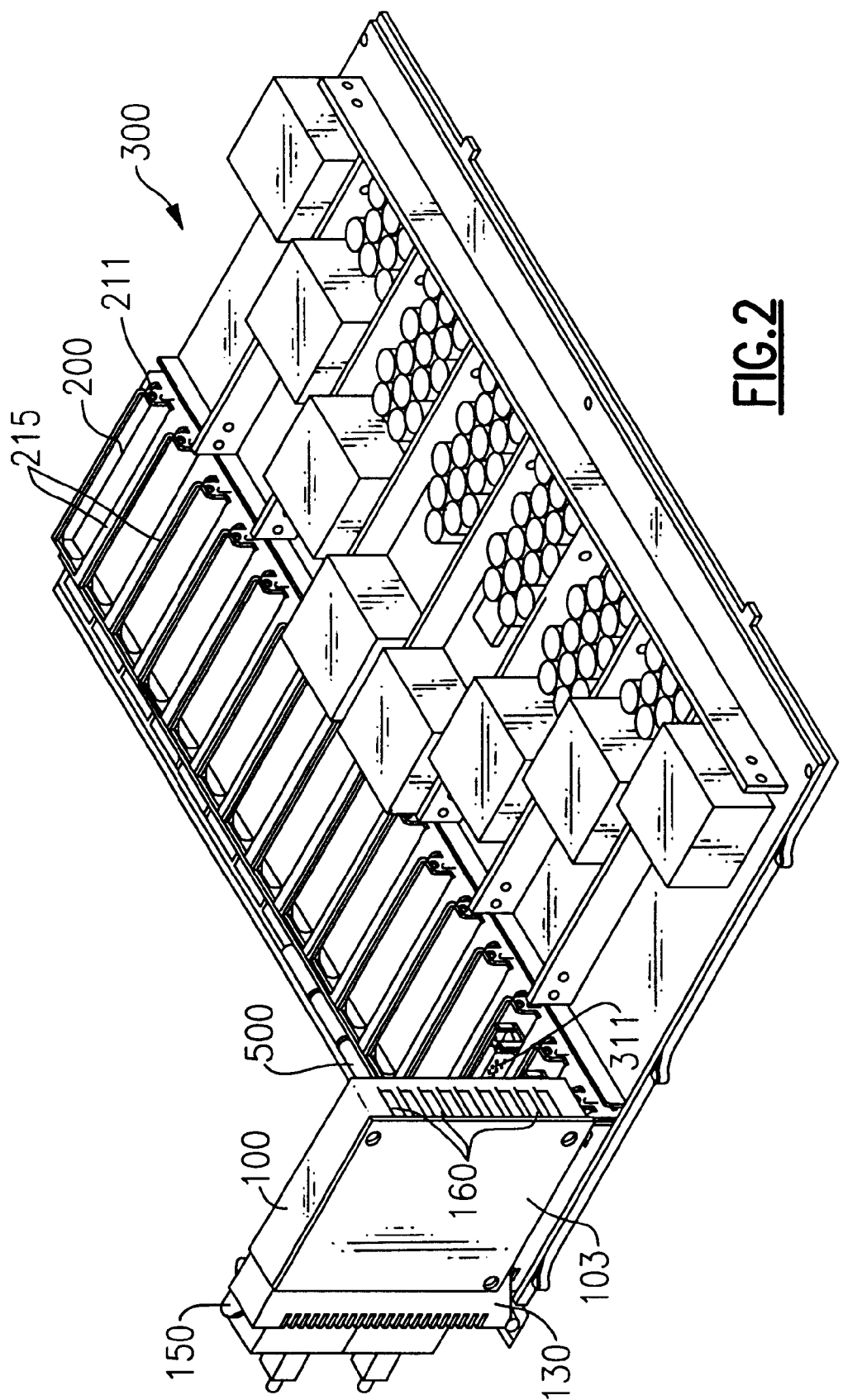
FIG. 2 is an isometric view similar to FIG. 1 but more particularly showing a cartridge in a position in which the cartridge, though not necessarily the printed circuit card, is fully inserted into a mating printed circuit board slot in which it is aligned and locked.

FIG. 2 provides a view of the present invention similar to that shown in FIG. 1 except that cartridge 100 is now shown fully inserted into guide structure 200. FIG. 2 also shows the inclusion of EMI shield spring 500 which is more thoroughly discussed below in reference to FIGS. 9A and 9B. Although not an essential feature of the present invention, it is completely compatible and cooperative with guide structure 200 and provides for continuous grounding by providing a solid electrical contact between metal front bezel portion 130 of cartridge 100 and guide structure 200.

Figure 3:
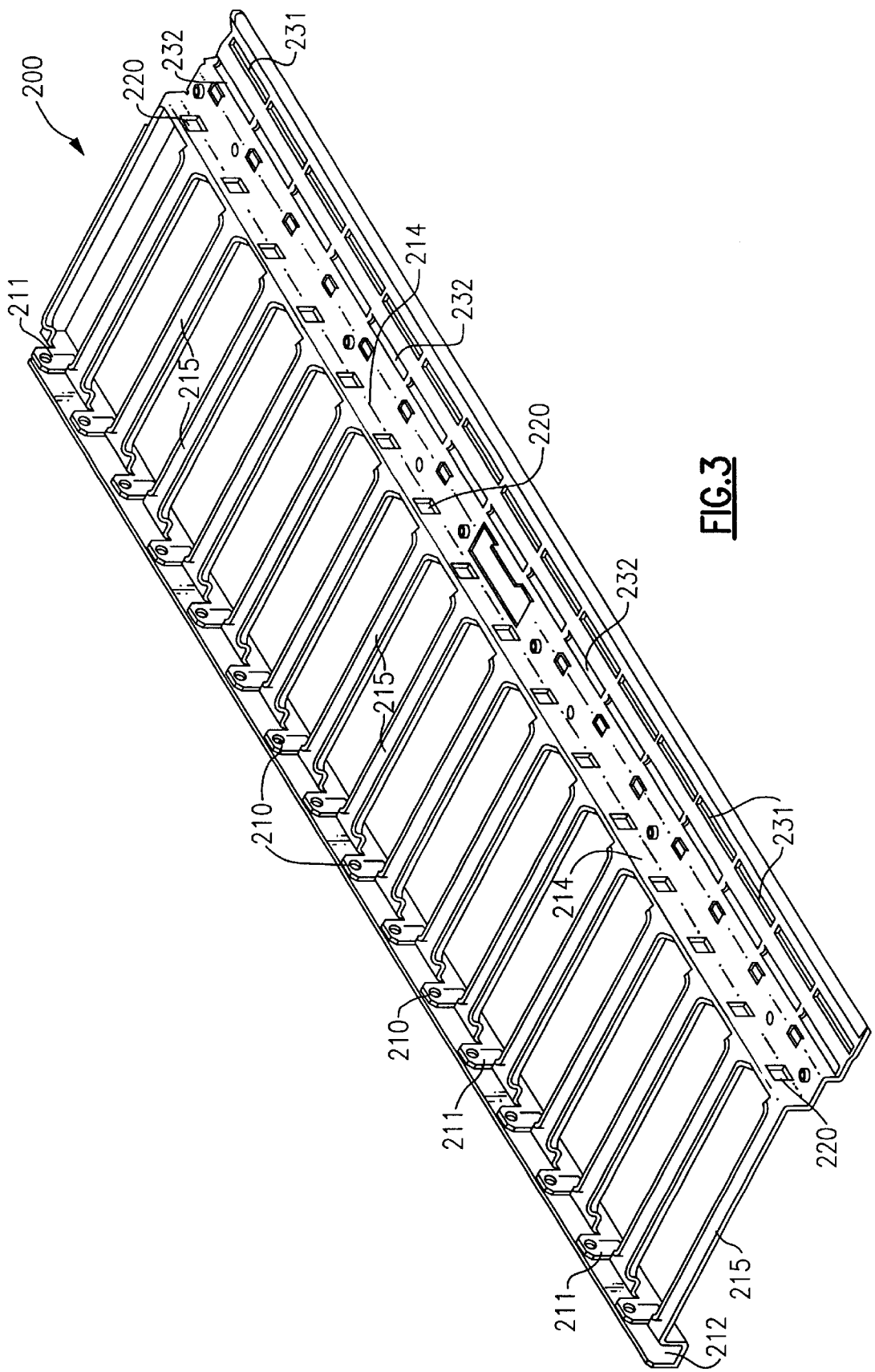
FIG. 3 is an isometric view of a guide of the present invention incorporating a plurality of guide slots and, as preferred, from a single sheet of stamped metal.

As shown in FIG. 3, it is seen that overall guide structure 200 possesses a generally ladder-like configuration. Guide structure 200 comprises three main portions: a rear portion, a front portion and rungs 215 extending between the front and rear portion to provide well defined slots for the insertion, the guiding and the locking into place of cartridge 100. As long as cartridge 100 is configured to have a substantially rectangular cross section, rungs 215 are substantially parallel. This is the preferred structure. However, it is noted that the present inventors appreciate the fact that if the cartridges possessed wedge shaped cross sections, then the present invention would still be applicable, with the only modification being that the rungs were no longer necessarily parallel but rather were conformed to the shape of the cartridge cross section.

FIG. 3 also illustrates the fact that preferred embodiments of the guide structure of the present invention include rear portion 212 which is formed as a channel or rib to provide an increased measure of rigidity both to overall guide structure 200, and also to printed circuit board 300 to which it is affixed so that connectors 311 are disposed between rungs 215. Guide structure 200 also includes a front portion which includes a step with vertical wall portion 214. Alignment apertures 220 are disposed within vertical step wall portion 214. This step also adds to the rigidity of the structure in substantially the same manner as channel 212. In preferred embodiments of the present invention apertures 220 are provided as square openings to accommodate matching locking pin 120 (see FIG. 6) on cartridge 100. While the locking function can be provided by either pin 110 (see FIG. 6) or pin 120, it is preferred that this function be provided at a forward location. The locking function is desirable for alignment purposes between the printed circuit card and board level connectors 311. Additionally, and more importantly, the locking function assures the user that the cartridge stays fixed as actuating arm 150 is moved so as to force the printed circuit card downward into connector 311.

The rear portion also includes vertical tabs 211 which contain alignment apertures 210 which are shaped to accept matching alignment pin 110 on cartridge 100. See FIG. 5. The forward or front portion of guide structure 200 include apertures 220. In preferred embodiments of the present invention apertures 210 and 220 are disposed along a mid line running between and parallel to rungs 215. The inclusion of the step in the forward portion also provides rigidity. Additionally, front portion of guide structure 200 also preferably includes two parallel rows of elongate apertures 231 and 232 for receipt of mating portions of shield spring 500 which. as is more particularly described below, includes formed pocket 502 with stamping formed contact prongs 503. Pocket 502 receives the forward edge of slot 231. Leading edge 512 of spring shield 500 extends through aperture 232.

FIG. 4 shows essentially the same features as shown in FIG. 3 albeit in an enlarged form. In particular, FIG. 4 provides a more detailed view of the structure of rungs 215. As cartridge 100 is slid into position between two adjacent rungs 215, rearward alignment is assured as tapered pin 110 on cartridge 100 enters aperture 210 in tab 211. Further pressure on bezel 130 urges locking pin (see FIGS. 6 and 8) 120 through aperture 220 to lock cartridge 100 into place. As a last step in insertion, actuating arm 150 on cartridge 100 is urged forward and in doing so the printed circuit card within the cartridge frame is moved downward so that its edge connector is inserted into board connector 311. This is accomplished without any substantial movement of cartridge 100. Movement is essentially limited to the actuating mechanism itself and to the printed circuit card.

FIG. 5 provides a more detailed view of a docked cartridge with alignment pin 110 extending through aperture 210 in tab 211. Also particularly visible here are apertures 160 in cartridge 100 which are provided in those circumstances in which cooling is desired, Additionally, air flow cooling apertures 142 are located in the front sides of bezel 130, which is preferably metal, especially when EMI is a factor (see FIGS. 1, 2 and 5)Also visible in FIG. 5 is the optional inclusion of base 350 which is provided when even greater levels of stiffening are required over and above that provided by guide structure 200 alone. Base 350 preferably comprises a flat polymeric material which is essentially, and preferably, coextensive with the horizontal dimensions of printed circuit board 300.

In addition to illustrating the presence of apertures 142 for the flow of cooling air, FIG. 6 shows a side view of already inserted cartridge 100. The side of cartridge bezel 130 which is opposite to the side shown in FIG. 6 also preferably includes an shield spring so that firm electrical contact for EMI shielding purposes is maintained between adjacently inserted cartridges. Additionally of note in FIG. 5 is the presence and location of EMI shield spring 500 which provides firm electrical connection between bezel 130 and guide structure 200.

Figure 7:
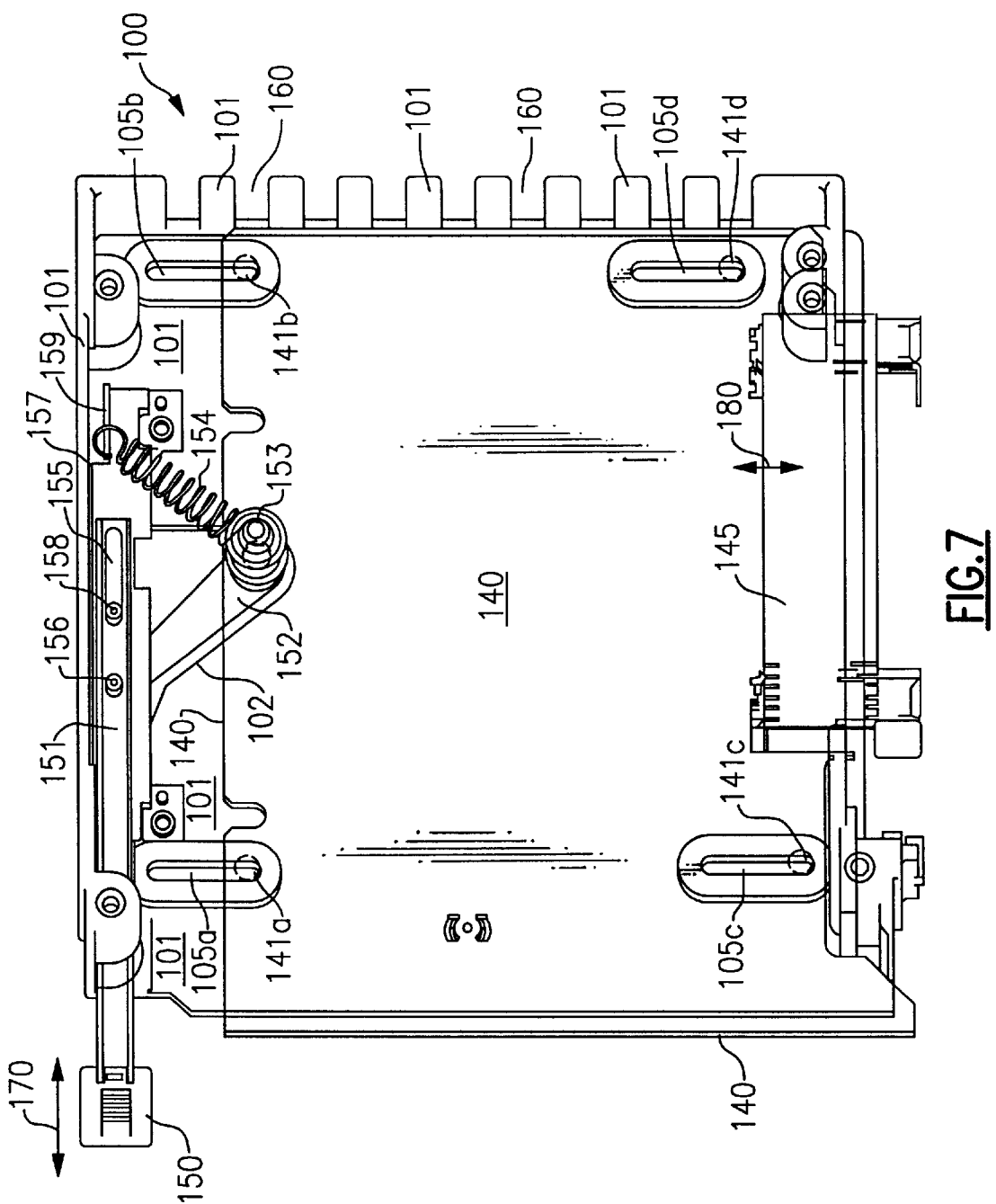
FIG. 7 is a side elevation view illustrating the interior construction of a cartridge of the present invention so as to particularly show the preferred actuating lever mechanism, the slidable mounting for the printed circuit card and the edge connector.

FIG. 7 illustrate two of the major components of cartridge 100: printed circuit card 140 (shown in phantom view) and back and side wall portion 101. FIG. 7 thus also shows the first stage in assembling cartridge 100. In particular, printed circuit card 140 with edge connector 145 is attached to back and side wall 101 by disposing pin (or pivot point) 153 through a matching aperture in card 140. This connects card 140 to the actuating mechanism. Printed circuit card 140 is also coupled to cartridge 100 by means of pins, screws or rivets 141a, 141b, 141c and 141d which are disposed within corresponding slots 105a, 105b, 105c and 105d, respectively. These pins and slots provide an interior guide mechanism which helps to assure a more uniform vertical motion for card 140. Pin or pivot point 153 includes any convenient mechanism for maintaining the pin in place relative to card 140, such as nuts or friction washers. Assembly of cartridge 100 is completed by adding front wall 103 which is preferably attached via screws through front wall 103 into mating screw holes formed in back and side wall portion 101. Both front wall 103 and back and side walls 101 preferably comprise an insulative polymeric material. Such wall structures are easily and preferably formed in molding operations. Lastly, bezel 130 is affixed to the front of cartridge 100 also preferably by screws or similar fastening devices. For flexibility, fastening devices employed in conjunction with the cartridge of the present should be removable.

FIG. 7 also illustrates a preferred mechanism for imparting vertical motion to printed circuit card 140. However, any convenient arrangement of pivoted levers may be employed. The only requirement for this mechanism is that it include an externally accessible portion and that it be capable of moving printed circuit card 140 in both downward and upward directions, the latter direction being required for cartridge removal in the event that removal is necessary. If cartridge removal is not a requirement then clearly upward motion is likewise not necessary. As shown, however, the actuation mechanism converts horizontal motion of arm 150 in the directions shown by arrow 170 into vertical motion of printed circuit card 140, as shown by arrow 180.

Actuating arm 150 includes internal portion 151 which slides within a channel provide for that purpose in plate 157 which is affixed to wall member 101. Internal arm portion 151 also includes slot 155 which receives fixed pin 158 which is preferably attached to plate 157. Internal arm portion 151 also includes pivot point 156 which is attached to connecting arm 152 which, for purposes of compactness, is disposed within and moves within recess 102 in back and side wall 101. The other end of connecting arm 152 is attached to printed circuit card 140 at pivot point 153, as described above. A preferred return bias mechanism in the form of spring 154 is also provided and is attached to any convenient point on printed circuit card 140 and to any fixed part of cartridge 100 in a manner so as to provide at least some vertical restorative force. Pivot point 153 is a desirably convenient location for this purpose, as is bracket 159 on plate 157.

FIG. 8 provides a more detailed view of a preferred structure for locking pin 120. In particular, FIG. 8 shows that it preferably comprises two portions, 120a and 120b, which are disposed through aperture 220 in front wall 214 of guide structure 200. Locking pin 120 is also tapered to permit cartridge removal. Locking pin 120 is preferably formed as part of the molding operation which produces back and side wall 101. However, any convenient detent providing structure may be employed to effectuate a locking function. Also visible in FIG. 8 are apertures 231 and 232 which are intended to receive EMI shield 500.

Figure 9A:
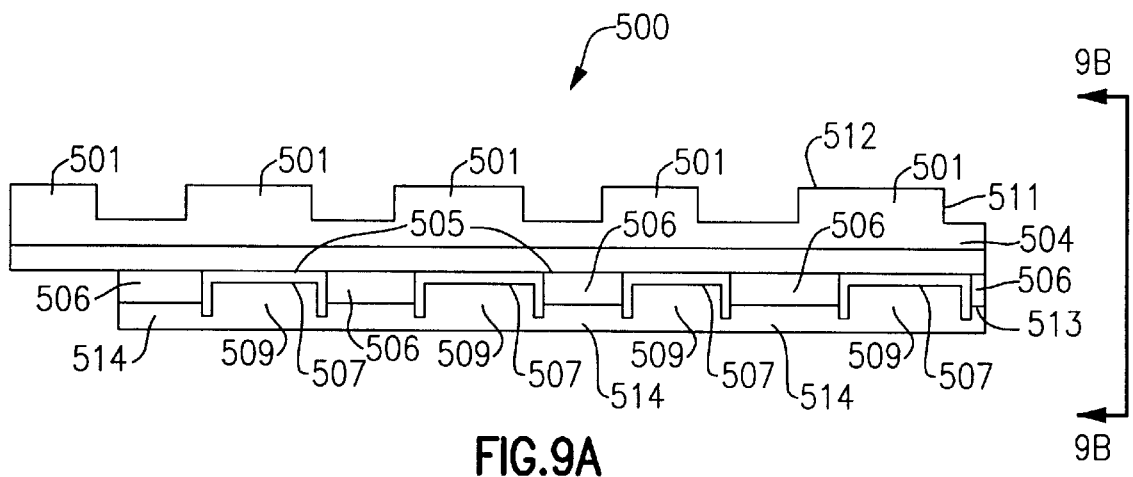
FIG. 9A is a top view of an EMI shield spring employable in conjunction with the EMI shield system of the present invention.
Figure 9B:
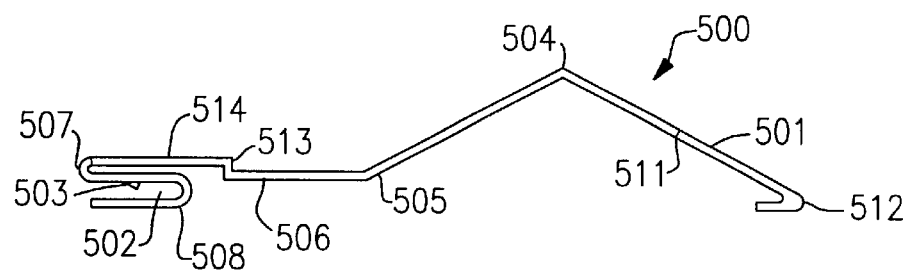
FIG. 9B is a side elevation view of the spring shown in FIG. 9A.

FIGS. 9A, 9B and 3 are also useful for illustrating part of an EMI shielding system employable in conjunction with preferred embodiments of the present invention. In particular, FIGS. 3 and 8 show the inclusion of EMI spring shield mounting apertures 231 and 232 in guide structure 200. EMI shield spring 500 is shaped to be readily inserted into apertures 231 and 232 in guide 200. In particular, aperture 231 includes a forward edge which engages a forwardly facing slot or pocket (reference numeral 502 in FIG. 9B). Accordingly, shield 500 includes an edge which is in firm electrical contact with guide 200. The other edge of shield 500 includes flexible portion 501 which extends through aperture 232. The leading edge portion of shield spring 500 includes peak 504 which electrically contacts bezel 130 during cartridge insertion (see FIG. 6).

FIGS. 9A and 9B provide a detailed description of the structure of EMI shield spring 500. This spring shield preferably comprises a single sheet of stamped metal which is formed as shown. Preferable materials for this shield spring include beryllium copper (½ hard) with an alternate material being stainless steel (½ hard). FIG. 9A provides a top view of the desired structure, and FIG. 9B provides an end view. There are apertures in spring shield 500 between edges 505 and 507. Region 509 is a tab region of the structure as is region 501. Top or peak 504 engages the bottom portion of bezel 130. Also of note is the presence of pocket or slot 502 which engages an edge of aperture 331 in guide 200. In particular, it is noted that stamped shield 500 preferably includes prongs 503 which are formed by the stamping operation employed in the manufacture of the shield spring. Prong 503 is also employed to provide improved electrical contact between shield 500 and guide 200. It is further noted that FIG. 9B is particularly useful in that it identifies a plurality of surfaces or edges that are also visible in FIG. 9A. Correspondingly numbered parts are shown in these two figures.

While the present invention has been presented in terms of the printed circuit card mounted connector being an "edge connector," there is no essential requirement for this exact placement, although it is certainly to be preferred for reasons of compactness. Likewise, the description above has been described as having a simple slide and pivot arm structure for printed circuit card insertion, with actuation being provided by an exteriorly accessed extension to the slidable arm and a bias spring return mechanism. However, any convenient arrangement of levers and pivot arms may be provided. Moreover, there is no absolute requirement that the connection between the slide actuation mechanism and the printed circuit card be located at or near the top edge of the printed circuit card even though this is the preferred location. Other locations are possible which provide greater mechanical advantage but which would require a greater deal of cooperation with the circuit card designers who are most aware of appropriate non-peripheral card locations for mounting pivoting lever components. In a similar fashion, the present invention has been described as having the locking aperture being disposed in the vertical portion of the guide step and with the guide or alignment pin being shaped to mate with the opening in the vertical tab at the rear of the guide track structure. While this is the preferred arrangement these roles are easily reversed, however, with the alignment pin and the alignment pin aperture being disposed in the forward step portion. Additionally, it is noted that while it is generally preferred that guide structure 200 comprises metal and that it be fabricated by stamping and forming methods, it is also possible to employ molded polymeric materials in the formation of guide structure 200, especially where electrical conductivity for EMI shielding purposes is not a factor.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A guide especially suited for insertion of self-contained pluggable printed circuit board cartridges, said guide comprising:

a rear portion having at least one vertical tab with an alignment aperture in said tab;

a forward portion including a step, said forward portion also having at least one alignment aperture in a vertical portion of said step; and at least one pair of cartridge slot defining rungs extending from said rear portion to said forward portion with said pair of rungs being disposed on opposite sides of a matching pair of said alignment apertures one of which is disposed in said tab with the other aperture being disposed in said vertical step.

2. The guide of claim 1 in which said rear portion, said forward portion and said rungs form an i integral structure.

3. The guide of claim 1 in which said rear portion, said forward portion and said rungs comprise an integral metal stamping.

4. The guide of claim 1 in which there are a plurality of said cartridge slot defining rungs with each adjacent pair of said rungs having associated therebetween at least one aperture containing tab and aperture containing step portion.

5. The guide of claim 1 in which at least one of said matching pair of apertures is shaped to accommodate a portion of said cartridge so as to provide a locking function in cooperation with a locking pin disposed on said cartridge.

6. The guide of claim 5 in which it is the aperture in said step that provides said locking function.

7. The guide of claim 1 further including a printed circuit board to which it is affixed.

8. The guide and circuit board of claim 7 in which said circuit board includes at least one pluggable electrical connector affixed to said printed circuit board and disposed between an adjacent pair of said rungs.

9. The guide and circuit board of claim 8 further including a printed circuit card cartridge with projections which mate with said matching apertures.

10. The guide and circuit board of claim 9 in which said aperture in said step is used to provide a locking function in cooperation with a corresponding locking pin on said cartridge.

* * * * *

UNITED STATES PATENT AND TRADEMARK OFFICE
CERTIFICATE OF CORRECTION

PATENT NO.    : 6,493,235 B1
DATED         : December 10, 2002
INVENTOR(S)   : Dennis Barringer et al.

It is certified that error appears in the above-identified patent and that said Letters Patent is hereby corrected as shown below:

<u>Column 10,</u>
Line 11, "forward portion and said rungs form an i integral structure." should be
-- forward portion and said rungs form an integral structure. --

Signed and Sealed this

Twenty-sixth Day of August, 2003

JAMES E. ROGAN
*Director of the United States Patent and Trademark Office*